(12) United States Patent
O'Donnell et al.

(10) Patent No.: US 7,447,439 B2
(45) Date of Patent: Nov. 4, 2008

(54) OPTICAL DUPLEXER AND OPTICAL TRIPLEXER

(75) Inventors: Adrian O'Donnell, Ottawa (CA); Fang Wu, Ottawa (CA); Valery I. Tolstikhin, Kanata (CA)

(73) Assignee: Enablence Inc., Kanata, Ontario (CA)

( * ) Notice: Subject to any disclaimer, the term of this patent is extended or adjusted under 35 U.S.C. 154(b) by 470 days.

(21) Appl. No.: 10/840,279

(22) Filed: May 7, 2004

(65) Prior Publication Data

US 2005/0249504 A1    Nov. 10, 2005

(51) Int. Cl.
    *H04B 10/00*    (2006.01)
(52) U.S. Cl. .................. 398/138; 398/135; 398/137; 398/139; 398/140; 398/42; 398/67; 398/72; 385/14; 385/37; 385/47
(58) Field of Classification Search ......... 398/132–172; 385/14–24; 375/219
    See application file for complete search history.

(56) References Cited

U.S. PATENT DOCUMENTS

| | | | | |
|---|---|---|---|---|
| 5,787,215 | A * | 7/1998 | Kuhara et al. ................ | 385/88 |
| 6,377,379 | B1 * | 4/2002 | Bruno et al. ................ | 398/141 |
| 6,674,967 | B2 | 1/2004 | Skrobko et al. | |
| 2003/0113053 | A1 * | 6/2003 | Kuramata ................ | 385/14 |
| 2004/0033004 | A1 * | 2/2004 | Welch et al. ................ | 385/14 |
| 2005/0100273 | A1 * | 5/2005 | Kim et al. ................ | 385/24 |
| 2005/0201665 | A1 * | 9/2005 | Manderscheid ................ | 385/14 |

OTHER PUBLICATIONS

Hashimoto et al: "A 1.3/1.55-mm Wavelength-Division Multiplexing Optical Module Using a Planar Lightwave Circuit for Full Duplex Operation", Journal of Lightwave Technology, vol. 18, No. 11, Nov. 2000, p. 1541-1547.*

Yoshida et al: "Low-Cost Hybrid-Integrated Optical Modules for FTTH and WDM Subscriber Systems", ECOC'98, Sep. 20-24, 1998, p. 629-630.*

NEC: "Optical Triplexer Module for PON ONU", published on http://www.nec.co.jp/on/dd/products/pon-onu_triplexer/OD-T6211.pdf.*

Hashimoto et al: "A 1.3/1.55-mm Wavelength-Division Multiplexing Optical Module Using a Planar Lightwave Circuit for Full Duplex Operation", Journal of Lightwave Technology, vol. 18, No. 11, Nov. 2000, p. 1541-1547.*

Poguntke et al: "Simultaneous multiple wavelength operation of a multistripe array grating integrated cavity laser", Appl. Phys. Letter. 62(17), Apr. 1993, pp. 2024-2026.*

Poguntke et al: "Simultaneous multiple wavelength operation of a multistripe array grating integrated cavity laser", Appl. Phys. Letter. 62(17), Apr. 1993, pp. 2024-2026.*

* cited by examiner

*Primary Examiner*—Kenneth Vanderpuye
*Assistant Examiner*—Li Liu
(74) *Attorney, Agent, or Firm*—Teitelbaum & MacLean; Neil Teitelbaum; Doug MacLean

(57) ABSTRACT

An optical triplexer design is described in which external optical signals at a first wavelength range propagate through a laser source. The laser source provides optical signals having a second wavelength range. The triplexer features a photodetector for providing intensity feedback signals to the lasers source and a dense wavelength division multiplexer for demultiplexing the external optical.

23 Claims, 4 Drawing Sheets

OPTICAL DUPLEXER AND OPTICAL TRIPLEXER

FIELD OF THE INVENTION

The invention relates to optical duplexers and triplexers. These optical components are often used in fiber-to-the-home (FTTH) systems. More specifically, the invention relates to the design and layout of components on an optical substrate for the purpose of producing efficient and low cost optical duplexers and triplexers.

BACKGROUND

Fiber-to-the-home (FTTH) systems support a variety of communication devices and services. Whilst multiple architectures have been proposed and assessed the dominant approach today is based upon that of a Passive Optical Network (PON) that provides for a distribution of services to customers over a reduced physical infra-structure. As the services provided evolve then the industry standards cover a series of steps from Broadband-PON (B-PON) through Ethernet-PON (E-PON), to Gigabit-PON (G-PON) and ultimately to Wavelength Division Multiplexed PON (WDM-PON).

Common to all of these PON architectures and FTTH systems is the requirement for a subscriber interface that provides and receives optical signals via a single optical waveguide. The use of bi-directional transmission over the single optical waveguide reduces the infrastructure requirements and further lowers cost. From the emergent industry standards the FTTH system is generally based upon the use of optical signals at three wavelengths (at approximately 1310 nm/1490 nm/1550 nm) and a component that provides the subscriber interface at the set-top box or residence interface is called a triplexer. This optical triplexer transmits one optical signal upstream (at approximately 1310 nm) whilst it receives two optical downstream signals at approximately 1490 nm and 1550 nm wavelengths. These signals are separated by wavelength allowing a first wavelength, typically 1550 nm, to be dedicated to video signals and the second wavelength, typically 1490 nm, to be used for voice and data signals.

At present such an optical triplexer would be manufactured by combining a variety of discrete components into an assembly. These components include: a 1310 nm laser source with a photodiode for providing a feedback signal, a first wavelength division multiplexer (WDM) for segregating the 1310 nm signals from the 1490 nm and 1550 nm signals, a second WDM for separating the 1490 nm signals from the 1550 nm signals and a set of photodetectors for sensing the 1490 nm and 1550 nm signals. Said laser and photodetectors being previously assembled and hermetically sealed components in their own rights. As such these triplexers are expensive due to using multiple sub-components which are highly manufactured entities themselves, alongside the high labor elements of combining these components both physically but also performing the final alignment and adjustment. As such these triplexers are sufficiently expensive that system carriers do not commercially support their use in single family dwellings thereby limiting the penetration of very high speed services to the general population.

Instead it would be highly desirable to provide all the necessary components in a single waveguide substrate, or chip. Unfortunately, the present state of optical technology suggests that the optical triplexer components be integrated monolithically onto an indium phosphide based waveguide component and even then these components are not easily combined. Specifically, any common waveguide portion of the device is intended to support 1310 nm, 1490 nm and 1550 nm optical signals simultaneously. Although passive optical waveguides will support these widely separated wavelengths over reasonable distances it is very difficult to produce an active waveguide substrate with an optical waveguide that supports optical signals at all three wavelengths with good performance. Consequently, the integrated optical triplexers feature common waveguides that are intended to propagate optical signals at the longest supported wavelength, in this case 1550 nm. Unfortunately, this results in substantial attenuation of any optical signals provided by the 1310 nm wavelength source. It would be beneficial to provide an optical triplexer that does not substantially attenuate 1310 nm optical signals.

As such searches for prior art of integrated optical triplexers result in an absence of material. Current research and identified prior art relates to the integration of solely the WDM elements onto a planar waveguide substrate such as silica-on-silicon and the subsequent hybrid integration of these along with the semiconductor laser and photodetectors.

SUMMARY OF INVENTION

The invention teaches an optical component comprising:
a substrate;
a laser for providing light at a characteristic wavelength corresponding to a laser wavelength range, the laser having a first laser port and a second laser port, the second laser port for receiving a first external optical signal having wavelengths corresponding to a first predetermined wavelength being other than of the laser wavelength range;
a first photodetector disposed on said substrate and optically coupled to the laser, said first photodetector for providing data in response to an intensity of an optical signal provided by the laser;
a filter having a first output port and an input port, the filter for receiving light at said input port comprising the first external optical signal and for filtering said light in dependence upon wavelength, said filter for providing light corresponding to the first predetermined wavelength range at the first output port; and,
a second photodetector disposed on said substrate and optically coupled to the first output port, said second photodetector for providing a data output signal in response to an intensity of light incident thereon.

The invention also provides a storage medium for storing instructions for, when executed, resulting in a design for an optical component, the optical component comprising:
a substrate;
a laser for providing light at a characteristic wavelength corresponding to a laser wavelength range, the laser having a first laser port and a second laser port, the second laser port for receiving a first external optical signal having wavelengths corresponding to a first predetermined wavelength being other than of the laser wavelength range;
a first photodetector disposed on said substrate and optically coupled to the laser, said first photodetector for providing data in response to an intensity of an optical signal provided by the laser;
a filter having a first output port and an input port, the filter for receiving light at said input port comprising the first external optical signal and for filtering said light in dependence upon wavelength, said filter for providing light corresponding to the first predetermined wavelength range at the first output port; and, a second photodetector disposed on said substrate and optically coupled to the first output port, said second photodetector for providing a data output signal in response to an intensity of light incident thereon.

Embodiments of the invention describe an optical component comprising:

a substrate having an communication port;

a laser for providing light at a characteristic wavelength corresponding to a laser wavelength range, the laser comprising an energy injection region;

a filter disposed on said substrate, said filter having an input port a first output port and a second output port, said filter for receiving light at said input port and dispersing said light in dependence upon wavelength, said filter for providing light corresponding to a first predetermined wavelength range at the first output port, the first wavelength range being other than of the laser wavelength range, the filter for providing light corresponding to the laser wavelength range at the second output port, the second output port optically coupled to the energy injection region of the laser, the input port optically coupled to the communication port;

a first photodetector disposed on said substrate and optically coupled to the laser, said first photodetector for providing data in response to an intensity of an optical signal provided by the laser; and, a second photodetector disposed on said substrate and optically coupled to the first output port of the filter, said second photodetector for providing a data output signal in response to an intensity of light incident thereon.

Further, the invention teach a storage medium for storing instructions for, when executed, resulting in a design for an optical component, the optical component comprising:

a substrate having an communication port;

a laser for providing light at a characteristic wavelength corresponding to a laser wavelength range, the laser comprising an energy injection region;

a filter disposed on said substrate, said filter having an input port a first output port and a second output port, said filter for receiving light at said input port and dispersing said light in dependence upon wavelength, said filter for providing light corresponding to a first predetermined wavelength range at the first output port, the first wavelength range being other than of the laser wavelength range, the filter for providing light corresponding to the laser wavelength range at the second output port, the second output port optically coupled to the energy injection region of the laser, the input port optically coupled to the communication port;

a first photodetector disposed on said substrate and optically coupled to the laser, said first photodetector for providing data in response to an intensity of an optical signal provided by the laser; and, a second photodetector disposed on said substrate and optically coupled to the first output port of the filter, said second photodetector for providing a data output signal in response to an intensity of light incident thereon.

BRIEF DESCRIPTION OF THE DRAWINGS

The invention will now be described with reference to the figures in which.

DETAILED DESCRIPTION OF THE INVENTION

The optical signals described herein are provided very specific wavelength values, such as 1550 nm. A person of skill in the art of optical networking will realize that such wavelengths describe commonly used wavelength ranges (or bands) and therefore it should be understood that a 1554 nm optical signal would be treated as a 1550 nm for the purpose of routing the signal within a coarse component. In contrast, a 1550 nm signal should not be confused with a 1551 nm signal where dense wavelength division multiplexing (DWDM) components are concerned.

Figure 1:
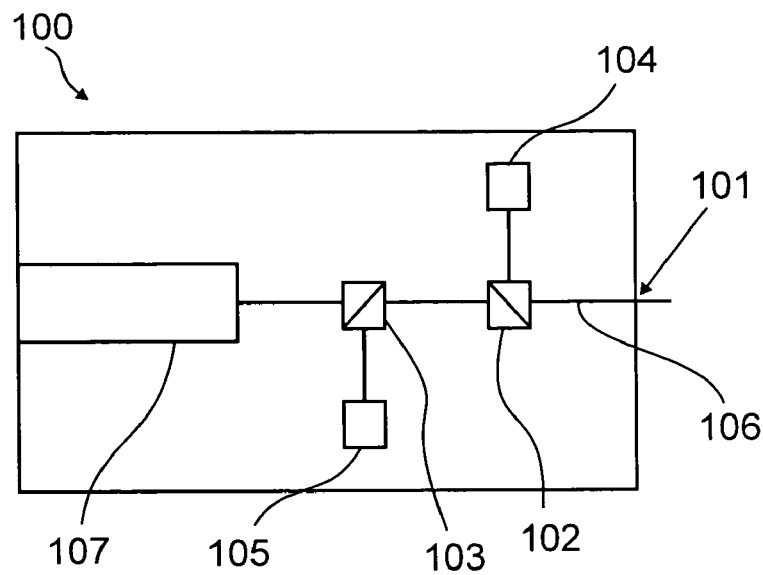
FIG. 1 is a schematic diagram of an optical triplexer design according to the prior art.

Referring to FIG. 1, a prior art referenced optical triplexer 100 is illustrated. In U.S. Pat. No. 6,674,967 by Skrobko et al. (Skrobko) such a prior art optical triplexer is disclosed along with a gain control. The optical triplexer 100 comprises: an optical input/output port 101, a first WDM 102, a second WDM 103, a first photodetector 104, a second photodetector 105, a common optical path 106 and a laser source 107 for providing 1310 nm optical signals. In use, optical signals at 1490 nm and 1550 nm wavelengths are provided to the triplexer via the input/output port 101, these signals propagate along the common optical path 106, which is typically free-space propagation in air, to the first WDM 102, which separates the 1550 nm wavelength signal from the 1490 nm wavelength signal. The 1550 nm signal propagates to the first photodetecter 104 to produce corresponding electrical signals. The 1490 nm optical signal continues to propagate along the common waveguide until it is received by the second WDM that diverts the 1490 nm optical signal to the second photodetector 105. The second photodetector 105 provides electrical signals corresponding to the 1490 nm optical signal.

The laser source 107 provides optical signals at 1310 nm. These optical signals propagate to the common optical path 106, through the WDMs 102 and 103 and out the input/output port 101. As a person of skill in the art of optical waveguide design will be aware, it is best to avoid having the 1310 nm wavelength signal propagate within an active substrate waveguide designed to support optical signals at 1550 nm, namely the common optical path of the triplexer 106. Consequently, a monolithic semiconductor implementation of the optical triplexer 100 partially attenuates the 1310 nm optical signal that it produces. Consequently, the 1310 nm laser source 107 provides optical signals at substantially higher intensity than the intensity provided at the input/output port 101. Unfortunately, this reduction in apparent power of the laser source 107 directly increases the cost of the triplexer by increasing complexity of the laser design employed. In some circumstances this represents a considerable problem for optical network designers. When the optical signal provided by the optical triplexer need to have a sufficient intensity that is not supported using a design according to FIG. 1 it may be necessary to use an optical triplexer that relies on an assembly of discrete components. Unfortunately, these assemblies are bulky, costly and somewhat prone to failure due to their relative complexity. Thus, the prior art device of FIG. 1 is adequate in some cases but it not does provide sufficiently intense 1310 nm optical signals for many other applications.

Figure 2:
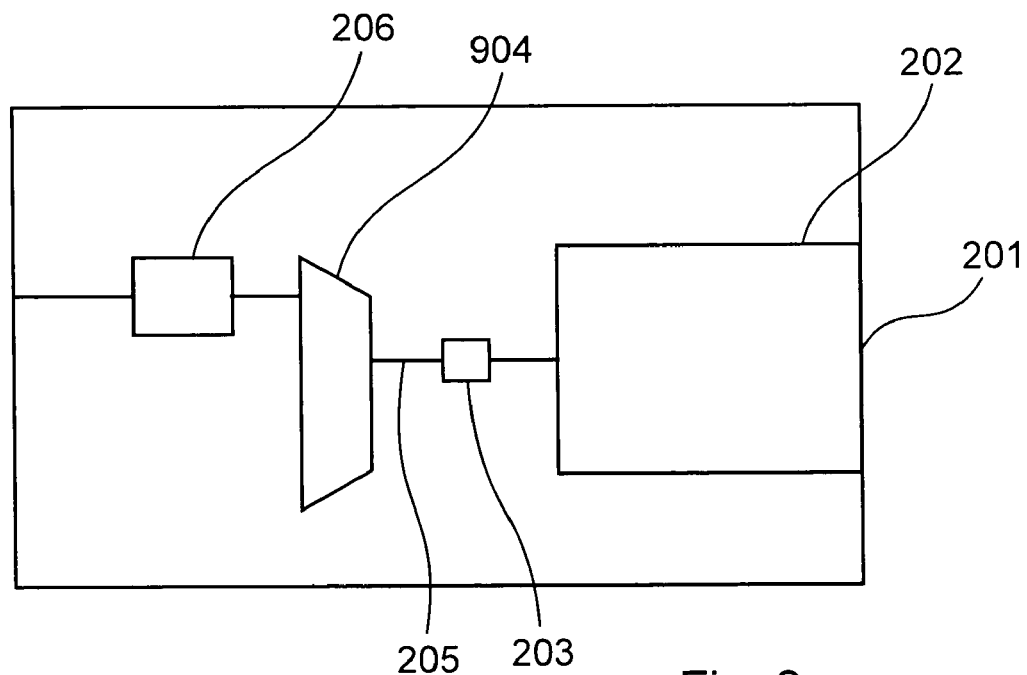
FIG. 2 is a schematic diagram of an optical diplexer according to a first embodiment of the invention.

Referring to FIG. 2, an optical diplexer according to a first embodiment of the invention is shown. Unlike an optical triplexer that is intended to receive optical signals at either of two wavelength ranges, an optical diplexer only receives optical signals at a single wavelength range. The optical diplexer according to the first embodiment of the invention comprises: an input/output port 201, a laser source 202, a feedback photodetector 203, a filter 904, a common waveguide 205 and photodetector 206 all of which are provided on a diplexer substrate. Additionally, an external waveguide 208 is shown. In use, an optical signal at 1550 nm is provided from the external waveguide 208 to the optical diplexer via the input/output port 201. The optical signal propagates to the filter 904 via the laser source 202 and the feedback photodetector 203. A substantial portion of the 1550 nm optical signal then propagates to photodetector 206 where it is received. The laser source 202 provides a 1310 nm optical signal. A portion of the 1310 nm optical signal is coupled to the external waveguide 208 via the input/output port 201. A second portion of the 1310 nm optical signal is received by the feedback photodetector 203. The feedback photodetector 203 provides signals that are useful in controlling the output power of the laser.

Figure 3:
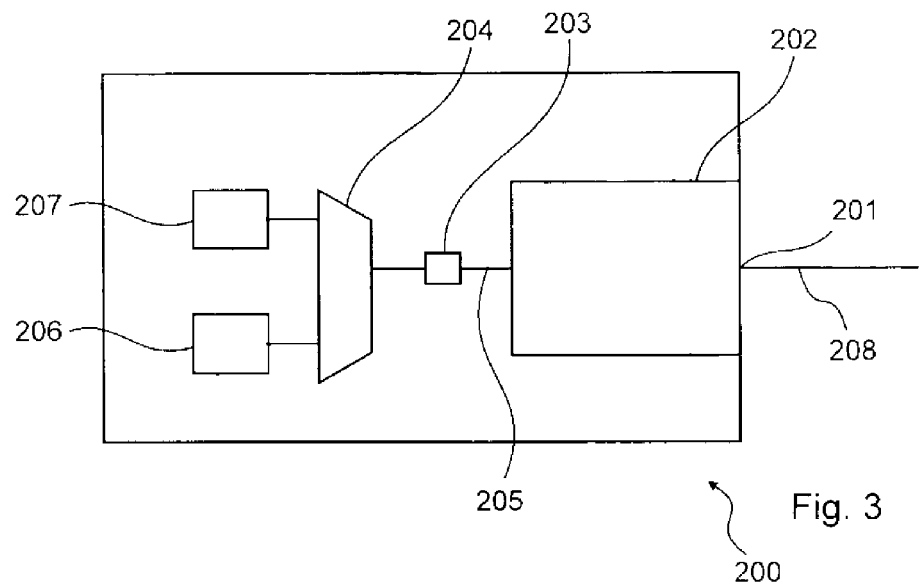
FIG. 3 is a schematic diagram of an optical triplexer design according to a second embodiment of the invention.

Referring to FIG. 3, an integrated triplexer 200 according to a second embodiment of the invention is illustrated. The triplexer 200 comprises: an input/output port 201, a laser source 202, a feedback photodetector 203, a wavelength dispersive element 204, a common waveguide 205 and photodetectors 206 and 207 all of which are provided on a triplexer substrate. Additionally, an external waveguide 208 is shown. In use, the laser source 202 provides optical signals at 1310 nm via the input/output port 201. The laser source 202 also provides a feedback optical signal at 1310 nm that propagates along the common waveguide 205 and is partially received by the feedback photodetector 203. A person of skill in the art will realize that partial attenuation of the feedback optical signal is easily compensated for by, for example, modifying the gain of the feedback sensor.

Optical signals provided by the external waveguide 208 propagate from the input/output port 201, through the laser cavity 202, along the common waveguide to the feedback photodetector 203. Portions of the 1490 nm and 1550 nm signals propagate through the feedback photodetector 203, along the common waveguide 205 and are received by the wavelength dispersive element 204. The 1490 nm and 1550 nm signals are then separated in dependence upon wavelength. The wavelength dispersive element 204 directs 1490 nm optical signals to photodetector 206 and 1550 nm optical signals to photodetector 207. Optical signals at 1310 nm received by the wavelength dispersive element 204 are substantially prevented from coupling to photodectors 206 and 207. A portion of the 1490 nm/1550 nm signals is received by the feedback photodetector 203 leading to a potential error in the feedback signal. A person of skill in the art will be aware that in optical triplexer commercial applications the 1310 nm source provides an optical signal having a power of a few milliwatts whereas the received optical signals at 1490 nm and 1550 nm have a power in the range of a few microwatts. Since the power of the 1490 nm and 1550 nm signals is comparatively low relative to the feedback signal for the 1310 nm source, the feedback signal provided by the feedback photodetector 203 is negligibly affected by the presence of such 1490 nm and 1550 nm signals.

Advantageously, the optical signals provided by the laser source 202 to the input/output port 201 need not propagate through a common waveguide within the active substrate and therefore, unlike the prior art device of FIG. 1, are not partially attenuated by such a common waveguide. Thus, an optical triplexer according to the second embodiment of the invention is able to provide 1310 nm optical signals having substantially higher intensity absent an increase in output power in comparison with the prior art of FIG. 1.

A person of skill in the art will be aware that obvious variations of the second embodiment of the invention will provide advantages over the prior art. For example, the photodetectors for the 1490 nm and 1550 nm wavelengths are optionally other than disposed on the triplexer substrate 200. Since the triplexer substrate supports the integration of photodetectors thereon it is apparent that integrating the photodetectors on the triplexer substrate is cost effective and simple and, therefore, a rational design decision. A person of skill in the art will be aware of other such variations.

Figure 4:
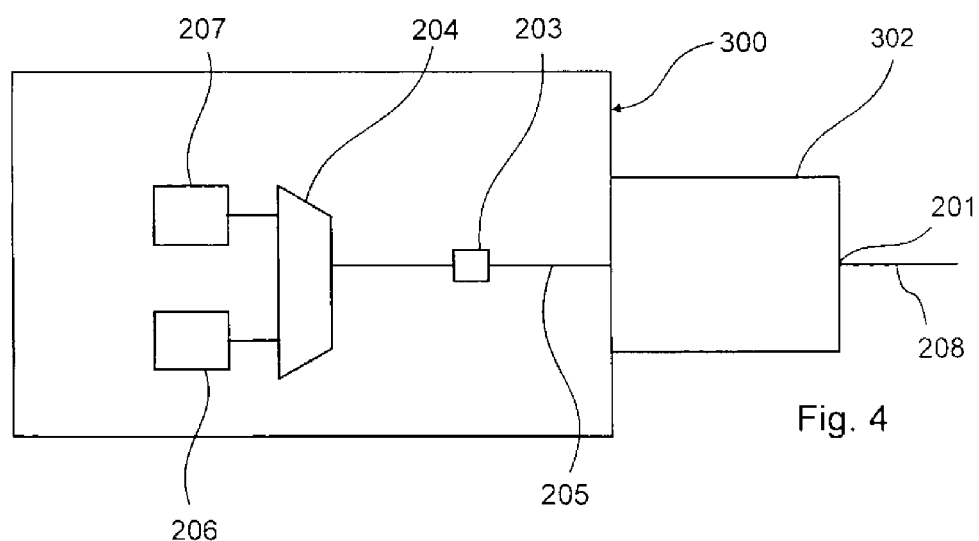
FIG. 4 is a schematic diagram of an optical triplexer according to a third embodiment of the invention in which the laser source is separate from the substrate.

In a third embodiment of the invention, described with reference to FIG. 4, a laser source 302 is disposed adjacent a substrate 300. The laser source 302 provides laser light from an input/output port 301 disposed on a first face. The laser source 302 also provides light from a second face opposite the first face. Light from the second face is coupled to the substrate 300. The substrate comprises: a feedback photodetector 203, a wavelength dispersive element 204, a common waveguide 205 and photodetectors 206 and 207. Light provided from the second face of the laser source 302 is coupled into the substrate and propagates the feedback photodetector 203. The feedback photodetector 203 senses a portion of the light incident thereon and provides an electrical feedback signal that is available to assist in the control of the laser source 302. A second portion of the light that is not absorbed by the feedback photodetector 203 propagates along the common waveguide 205 to the wavelength dispersive element 204 where it is dispersed in dependence upon its wavelength. Light having a wavelength of approximately 1490 nm is provided to first photodetector 206 and light having a wavelength of approximately 1550 nm is provided to a second photodetector 207. A person of skill in the art will appreciate that the third embodiment of the invention operates in a manner highly analogous to the second embodiment of the invention. Providing a laser source 302 that is separate from the substrate 300 supports the substitution of different laser sources absent providing different substrates.

Figure 5:
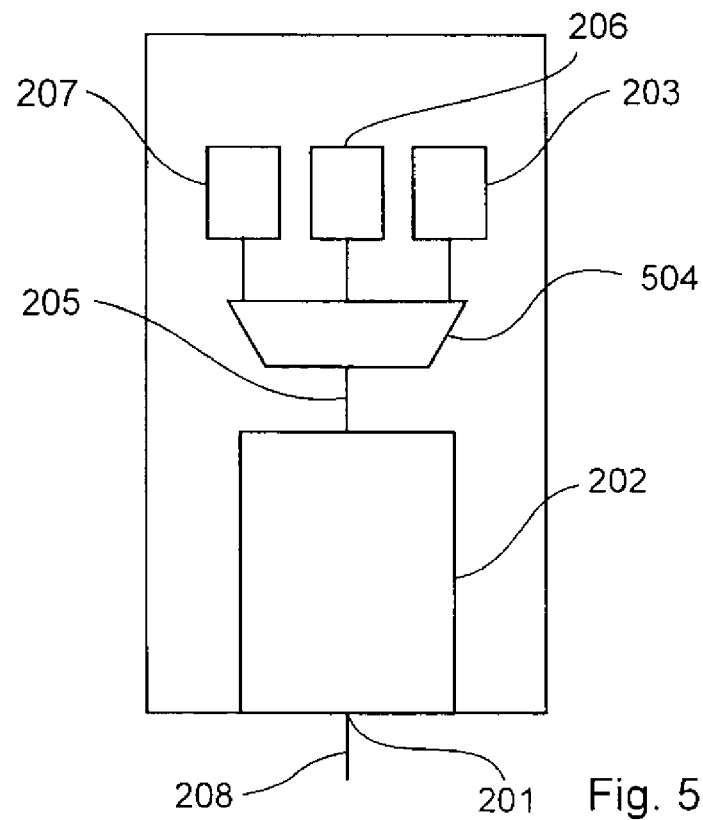
FIG. 5 is a schematic diagram of an optical triplexer according to a fourth embodiment of the invention in which a coarse WDM is used to separate optical signals at 1310 nm, 1490 nm and 1550 nm.

Referring to FIG. 5, an optical triplexer according to a fourth embodiment of the invention is shown. The triplexer 500 comprises: an input/output port 201, a laser source 202, a feedback photodetector 203, a wavelength dispersive element 504, a common waveguide 205 and photodetectors 206 and 207 all of which are provided on a triplexer substrate. Additionally, an external waveguide 208 is shown.

In use, the laser source 202 provides optical signals at 1310 nm via the input/output port 201. The laser source 202 also provides a feedback optical signal at 1310 nm that propagates along the common waveguide 205. Optical signals provided by the external waveguide 208 propagate from the input/ output port 201, through the laser cavity 202, along the common waveguide to the wavelength dispersive element 504. Additionally, a 1310 nm feedback signal from the laser source 202 propagates along the common waveguide to the feedback photodetector 203. The 1310 nm, 1490 nm and 1550 nm signals are then separated in dependence upon wavelength. The wavelength dispersive element 504 directs 1310 nm optical signals to the feedback photodetector 203, 1490 nm optical signals to photodetector 206 and 1550 nm optical signals to photodetector 207. This design is similar to the design presented according to the second embodiment of the invention however, in this embodiment the 1310 nm feedback signal does not depend from the 1490 nm and 1550 nm signals.

Figure 6:
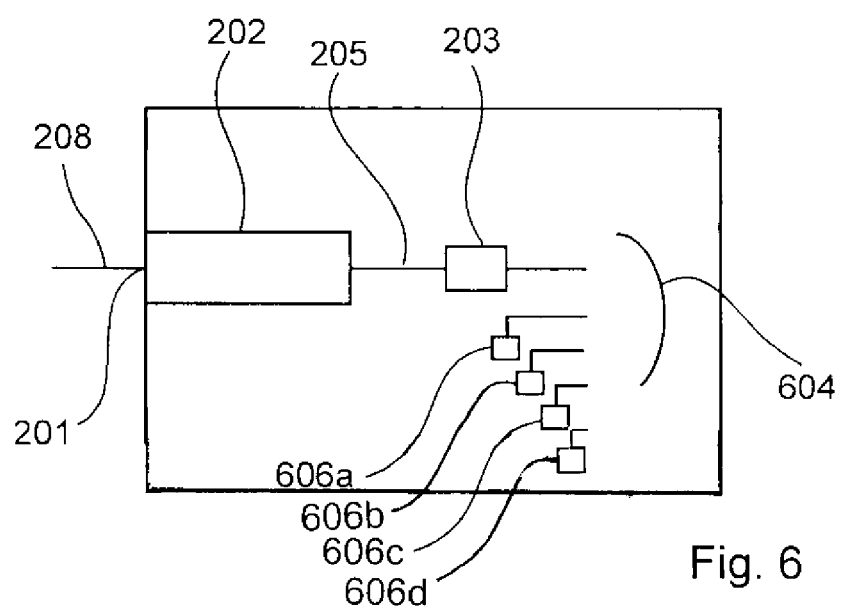
FIG. 6 is a schematic diagram of an optical triplexer according to fifth embodiment of the invention featuring a dense WDM demultiplexer allowing it to support a set of optical signals in the 1550 nm wavelength range.

Referring to FIG. 6 an optical triplexer featuring a dense wavelength division multiplxer according to a fifth embodiment of the invention is shown. The triplexer 600 comprises: an input/output port 201, a laser source 202, a feedback photodetector 203, a dense wavelength dispersive element 604, a common waveguide 205 and photodetectors 606a to 606d all of which are provided on a triplexer substrate. Additionally, an external waveguide 208 is shown.

In use, the laser source 202 provides optical signals at 1310 nm via the input/output port 201. The laser source 202 also provides a feedback optical signal at 1310 nm that propagates along the common waveguide 205 and is partially received by the feedback photodetector 203.

Optical signals provided by the external waveguide 208 propagate from the input/output port 201, through the laser source 202, along the common waveguide to the feedback photodetector 203. A portion of these signals is received by the feedback photodetector 203 leading to a false feedback signal. A person of skill in the art will be aware that in optical triplexer commercial applications the 1310 nm source provides an optical signal having a power of a few milliwatts whereas the received optical signals at 1550 nm have a power in the range of a few microwatts. Since the power of the 1550 nm signals is comparatively low relative to the feedback signal for the 1310 nm source, the feedback signal provided by the feedback photodetector 203 is negligibly affected by the presence of the 1550 nm signals. A portion of the 1550 nm signals propagate through the feedback photodetector 203, along the common waveguide 205 and are received by the wavelength dispersive element 604. The 1550 nm signals are then separated in dependence upon wavelength. The wavelength dispersive element 604 directs 1546 nm optical signals to photodetector 606a, 1548 nm optical signals to photodetector 606b, 1550 nm optical signals to photodetector 606c and 1552 nm optical signals to photodetector 606d. Optical signals at 1310 nm received by the wavelength dispersive element 204 are substantially prevented from coupling to photodectors 606a to 606d.

A person of skill in the art will be aware that the design of the optical triplexer according to the fifth embodiment of the invention is easily modified to support larger numbers of optical channels whose wavelength is proximate 1550 nm. Similarly, another variation of the design supports a plurality of wavelengths proximate the 1490 nm. Another variation of the device according to the invention supports sets of wavelengths at 1550 nm and sets of wavelengths at 1490 nm. Such a system provides a variety of benefits. First, in a region supporting, for example 16 optical triplexers, each of which receiving a same set of 16 1550 nm optical signals, each triplexer optionally uses one of the 16 1550 nm option signals to receive data. Thus, if each triplexer corresponds to one home, each home receives 1490 nm data signals for television and these 1490 nm signals are common to each home. Simultaneously, each home receives a dedicated 1550 nm data signal specific to that home. Such a data stream is optionally used for video on demand and high bandwidth file downloading from the Internet. Clearly, a wide variety of options will be apparent to one of skill in the art.

Figure 7:
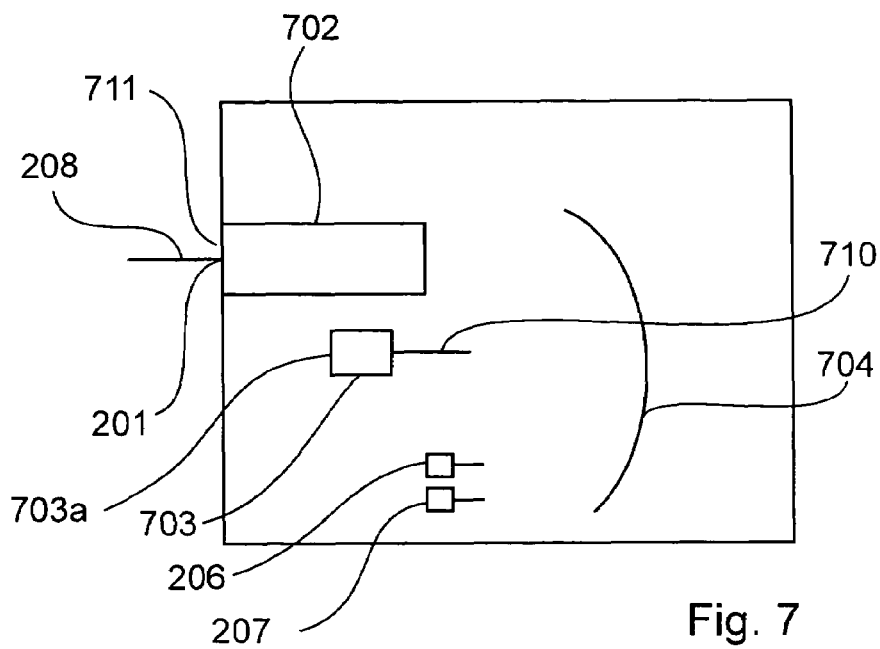
FIG. 7 is a schematic diagram of an optical triplexer according to a sixth embodiment of the invention featuring an optical multiplexer disposed within a lasing cavity; and, FIG. 8 is a schematic diagram of an optical triplexer according to seventh embodiment of the invention featuring an energy injection region for a laser source optically disposed between a photodetector and a wavelength dispersive element.

Referring to FIG. 7 an optical triplexer according to a sixth embodiment of the invention is shown. The optical triplexer comprises: an input/output port 201, an energy injection region 702, a photodetector with a reflective edge 703a, a waveguide 710, wavelength dispersive element 704, a partially reflective surface 711, and photodetectors 206 and 207. Additionally, an external waveguide 208 is shown. This embodiment of the invention incorporates design features of a multistripe array grating integrated cavity (MAGIC) laser to produce an optical triplexer. In operation, external optical signals having wavelengths of 1490 nm and 1550 nm propagate from the external waveguide 208 and enter the optical triplexer via the input/output port 201. The external optical signals propagate through the energy injection region 702 and are dispersed by the wavelength dispersive element 704. A portion of the 1490 nm optical signal propagates to photodetector 206. A portion of the 1550 nm optical signal propagates to photodetector 207. A 1310 nm laser cavity is provided between the partially reflective surface 711 proximate the input/output port 201 and the reflective surface 703a of photodetector 703. An optical signal at 1310 nm within the energy injection region 702 propagates to the wavelength dispersive element 704. The wavelength dispersive element 704 directs the 1310 nm optical signal to the waveguide 710. The 1310 nm optical signal propagates to the photodetector 703 and a portion of the optical signal is received by the photodetector 703. A feedback signal provided by photodetector 703 is optionally used for controlling an amount of energy provided to the energy injection region 702. A second portion of the 1310 nm optical signal is reflected by the reflective edge 703a and propagates back toward the wavelength dispersive element 704 via the photodetector 703 and the waveguide 710. The wavelength dispersive element 704 directs optical energy at 1310 mm received from waveguide 710 to the energy injection region 702. The optical path length between the reflective edge 703a and the partially reflective surface 711 is chosen to support lasing at 1310 nm. When the energy injection region 702 is sufficiently energized, a 1310 nm optical signal will propagate from the input/output port 201 to the external waveguide 208. The waveguide 710 serves to propagate optical signals at 1310 nm and therefore is designed to minimize attenuation of optical signals at that wavelength.

Figure 8:
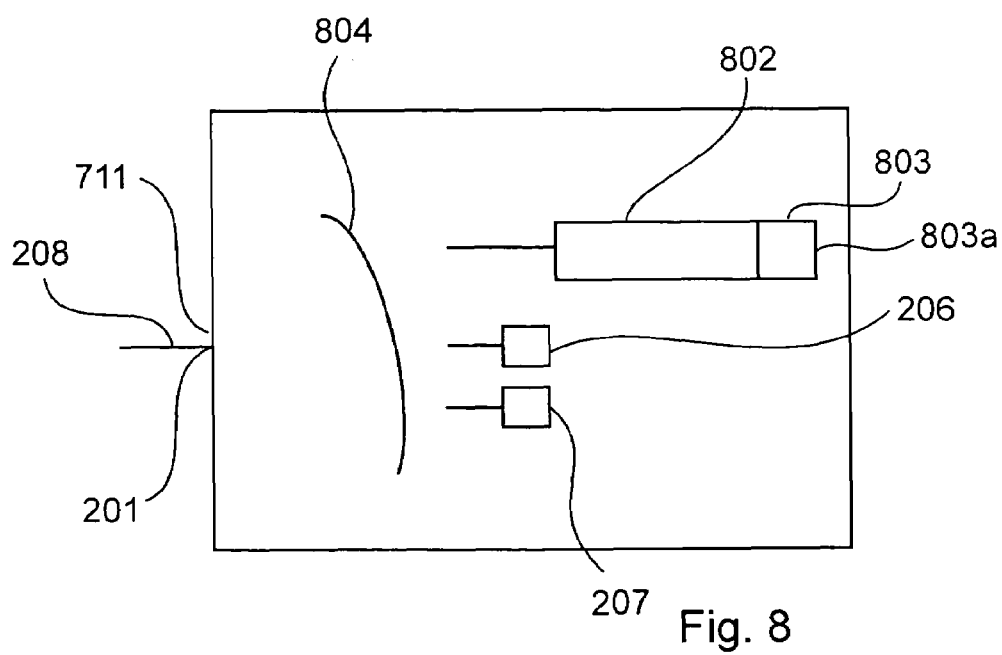

Referring to FIG. 8 an optical triplexer according to a seventh embodiment of the invention is shown. The seventh embodiment of the invention comprises: an input/output port 201, a partially reflective surface 711, a wavelength dispersive element 804, an energy injection region 802, a photodetector 803 having a partially reflective surface 803a, and photodetectors 206 and 207. In use, external optical signals having wavelengths of 1490 nm and 1550 nm propagate from the external waveguide 208 to the optical triplexer. The external optical signals propagate to the wavelength dispersive element 804 via the input/output port 201. The optical signals are then dispersed in dependence upon their wavelength. The optical signals having a wavelength of 1490 nm propagate to photodetector 206 and the optical signals having a wavelength of 1550 nm propagate to photodetector 207.

A 1310 nm laser cavity is disposed between the partially reflective surface 711 and the partially reflective surface 803a of the photodetector 803. Thus, an optical signal at 1310 nm provided from the energy injection region 802 propagates to the photodetector 803 where a portion of the signal is received. The photodetector 803 provides data that is useful in controlling the output power of the laser. A second portion of the signal propagates to the reflective surface 803a of the photodetector 803 and is reflected. The reflected signal propagates to the wavelength dispersive element 804 via the photodetector 803 and energy injection region 802. The wavelength dispersive element 804 directs the 1310 nm reflected signal to the input/output port 201. A portion of the reflected signal is reflected by the partially reflective surface 711. When the energy provided to the energy injection region 802 reaches an energy threshold a 1310 nm laser beam is provided to the external waveguide 208.

Clearly, a wide variety of variations of the embodiments of the invention will be apparent to one of skill in the art. For example, some embodiments of the invention incorporate wavelength dispersive elements while the first embodiment of the invention comprises a filter. A person of skill in the art will appreciate that different wavelength division multiplexing components are optionally incorporated, such as arrayed waveguide gratings (AWGs) and echelle gratings as wavelength dispersive elements. Additionally, a person of skill in the art will realize that there are a variety of different designs of optical duplexers are supported by the invention. For example, the first embodiment of invention is an optical duplexer that incorporates design features present in the optical triplexer disclosed in the second embodiment of the invention shown in FIG. 3. As a person of skill in the art of optical component design will appreciate, other designs of optical triplexers will support other corresponding designs for optical duplexers.

Since the embodiments of the invention incorporate active components it is suggested that the substrate comprise compound semiconductors of the three-five variety based around the ternary and quaternary materials of indium phosphide (InP). Clearly, a person of skill in the art will be aware of what material choices are applicable for a device according to the invention.

Numerous other embodiments of the invention will be apparent to a person of skill in the art of optical component design.

What is claimed is:

1. An optical component comprising:
   a substrate;
   a laser for providing light at a characteristic wavelength corresponding to a laser wavelength range, the laser having a first laser port and a second laser port, the second laser port for emitting a main optical signal in the wavelength range, and for receiving first and second external optical signals having wavelengths corresponding to first and second predetermined wavelength ranges being other than of the laser wavelength range;
   a first photodetector disposed on said substrate and optically coupled to the laser, said first photodetector for providing data in response to an intensity of a feedback optical-signal provided by the laser;
   a wavelength dispersive concave, reflective diffraction grating filter having first and second output ports and an input port, the filter for receiving light at said input port comprising the first and second external optical signals from the first laser port, and for dispersing said first and second external optical signals at different angles parallel to the substrate in dependence upon wavelength, said filter for providing light corresponding to the first and second predetermined wavelength ranges at the first and second output ports, respectively;
   a second photodetector disposed on said substrate and optically coupled to the first output port, said second photodetector for providing a data output signal in response to an intensity of light incident thereon; and
   a third photodetector disposed on said substrate and optically coupled to the second output port, said third photodetector for providing a data output signal in response to an intensity of light of the second external optical signal incident thereon.

2. An optical component according to claim 1, wherein the laser source is disposed directly on the substrate, and optically coupled to the first photodetector via a common waveguide, along which the first and second external optical signals propagate with the feedback signals.

3. An optical component according to claim 1, wherein the laser source comprises a first reflective coating, an energy injection region, and a second reflective coating;
   wherein the wavelength dispersive filter is disposed between the first and second reflective coatings for directing light at the laser wavelength range between the first and second reflective coatings and through the energy injection region.

4. An optical component comprising:
   a substate;
   a laser source for providing light at a characteristic wavelength corresponding to a laser wavelength range, the laser having a first laser port and a second laser port, the second laser port for receiving first and second external optical signals having wavelengths corresponding to first and second predetermined wavelength ranges being other than of the laser wavelength range;
   a first photodetector disposed on said substrate and optically coupled to the first laser port, said the first photodetector for providing data in response to an intensity of a feedback optical signal provided by the laser;
   a wavelength dispersive filter having first and second output ports and an input port, the filter for receiving light at said input port comprising the first and second external optical signals and for dispersing said first and second signals in dependence upon wavelength, said filter for providing light corresponding to the first and second predetermined wavelength ranges at the first and second output ports, respectively;
   a second photodetector disposed on said substrate and optically coupled to the first output port, said second photodetector for providing a data output signal in response to an intensity of light incident thereon; and
   a third photodetector disposed on said substrate and optically coupled to the second output port, said third photodetector for providing a data output signal in response to an intensity of light incident thereon;
   wherein the laser source comprises a first reflective coating, an energy injection region, and a second reflective coating;
   wherein the wavelength dispersive filter is disposed between the first and second reflective coatings for directing light at the laser wavelength range between the first and second reflective coatings and through the energy injection region;
   wherein the laser source also includes the first photdetector; and wherein the second reflective coating is on the first photodetector.

5. An optical component according to claim 1 wherein the substrate comprises an active material.

6. An optical component according to claim 5 wherein the substrate comprises a group III-V semi-conductor material.

7. An optical component according to claim 6 wherein the substrate comprises indium phosphide.

8. An optical component according to claim 1 wherein the first wavelength range comprises one of 1490 nm and 1550 nm and wherein the laser wavelength range comprises 1310 nm.

9. An optical component according to claim 1, wherein the filter comprises a third output port for receiving the feedback signal, and wherein the first photodetector is optically coupled to the third output port.

10. An optical component according to claim 9, comprising a waveguide optically disposed on said substrate such that an external optical signal coupled to and propagating from the laser source to the dispersive element propagates along said waveguide, the waveguide having an attenuation characteristic such that light having a wavelength corresponding to the laser wavelength range propagating within said waveguide is attenuated substantially more rapidly than light corresponding to either of the first and second wavelength ranges.

11. An optical component according to claim 10 wherein the first wavelength range comprises 1490 nm.

12. An optical component according to claim 11 wherein the second wavelength range comprises 1550 nm.

13. An optical component according to claim 12 wherein the laser wavelength range comprises 1310 nm.

14. An optical component according to claim 1, wherein the filter is a dense wavelength division multiplexing device and the second wavelength range corresponds to a predetermined wavelength band that is adjacent by wavelength to a first predetermined wavelength band corresponding to the first wavelength range and the predetermined wavelength bands are present on an ITU grid.

15. An optical component according to claim 14, further comprising: a fourth photodetector and a fifth photodetector, wherein the filter comprises: a third output port and a fourth output port, each of said output ports of the filter for providing an optical signal having a characteristic wavelength range, each of said output ports corresponding to a different wavelength range, the third output port optically coupled to the fourth photodetector and the fourth output port optically coupled to the fifth photodetector.

16. An integrated waveguide optical component comprising;
a substrate;
a laser disposed on said substrate for providing light at a caharacteristic wavelength corresponding to a laser wavelength range, the laser including: an energy injection region, an input/output port for launching a laser signal in the laser wavelength range and for receiving a first external optical signal at a first wavelength range, respectively, different from the laser wavelength range, and a laser output port for outputting the first external optical signal, and a feedback signal corresponding to the laser wavelength range;
a wavelength dispersive concave, reflective diffraction grating filter disposed on said substrate, said filter having an input port, a first output port and a second output port, said filter for receiving the first external optical signal and the feedback signal at said input port from the laser output port amd for dispersing said first external optical signal and said feedback signal at different angles parallel to the substrate in dependence upon wavelength, said filter for providing the first external optical signal at the first output port, and for providing the feedback signal at the second output port, the second output port optically coupled to the energy injection region of the laser;
a first photodetector disposed on said substrate and optically coupled to the laser, said first photodetector for providing data in response to an intensity of the feedback signal; and
a second photodetector disposed on said substrate and optically coupled to the first output port of the filter, said second photodetector for providing a data output signal in response to an intensity of the first external optical signal incident thereon.

17. An optical component according to claim 16, wherein the laser also includes a first reflective surface disposed at an edge of the optical components that is at least partially reflective to light at the laser wavelength range, and a second reflective surface at least partially reflective to light at the laser wavelength range, with the energy injection region therebetween;
wherein the second reflective surface includes the laser output port for outputting the feedback signal and the first external optical signal to the filter via a common waveguide.

18. An optical component according to claim 16, wherein the laser comprises a laser cavity including the energy injection region optically disposed between a first reflective surface and a second reflective surface;
wherein the filter is disposed in the laser cavity for directing light at the laser wavelength range between the first and second reflective coatings and through the energy injection region, and for directing the first external optical signal to the first output port.

19. An optical component according to claim 18, wherein the first photodetector is optically coupled to the second output port of the wavelength filter, and includes the second partially reflective surface.

20. An optical component according to claim 16, wherein the substrate comprises and active material.

21. An optical component according to claim 20, wherein the substrate comprises a group III-V semi-conductor material.

22. An optical component according to claim 21, wherein the substrate comprises indium phosphide.

23. An optical component according to claim 16, wherein the input/output port also receives a second external optical signal at a second wavelength range different than the first wavelength range and the laser wavelength range;
wherein the optical component further comprises; a third photodetector for providing data indicative of the second external optical signal incident thereon; and
wherein the filter includes a third output port optically coupled to the third photodetector, said filter for providing the second external optical signal at the third output port.

* * * * *